United States Patent

Hagiwara et al.

[11] Patent Number: 5,962,139
[45] Date of Patent: Oct. 5, 1999

[54] SEMICONDUCTOR SEALANT OF EPOXY RESIN AND ORGANIC POLYMER-GRAFTED SILICONE POLYMER

[75] Inventors: Shinsuke Hagiwara, Shimodate; Hiroyuki Saitoh, Tsukuba; Hiroki Sashima, Shimodate, all of Japan; Peter Huber, Burghausen, Germany; Bernward Deubzer, Burghausen, Germany; Michael Geck, Burghausen, Germany

[73] Assignees: Hitachi Chemical Co., Ltd., Tokyo, Japan; Wacker-Chemie GmbH, Munich, Germany

[21] Appl. No.: 09/015,213

[22] Filed: Jan. 29, 1998

Related U.S. Application Data

[62] Division of application No. 08/536,141, Sep. 29, 1995, Pat. No. 5,739,217.

[30] Foreign Application Priority Data

Oct. 7, 1994 [JP] Japan ..................... 6-244069

[51] Int. Cl.$^6$ .......................... B32B 27/04; B32B 27/38; C08L 63/04
[52] U.S. Cl. .................... 428/413; 428/416; 428/901; 525/476; 525/902
[58] Field of Search .................. 525/106, 476, 525/902; 428/413, 416, 901

[56] References Cited

U.S. PATENT DOCUMENTS

| | | | |
|---|---|---|---|
| 5,147,947 | 9/1992 | Yamamoto et al. | 525/63 |
| 5,312,878 | 5/1994 | Shiobara et al. | 525/507 |

FOREIGN PATENT DOCUMENTS

| | | |
|---|---|---|
| 378370 | 7/1990 | European Pat. Off. . |
| 385736 | 9/1990 | European Pat. Off. . |
| 553371 | 8/1993 | European Pat. Off. . |
| 559338 | 9/1993 | European Pat. Off. . |
| 4233450 | 4/1993 | Germany . |
| 62-93962 | 4/1987 | Japan . |
| 63-93962 | 4/1987 | Japan . |

OTHER PUBLICATIONS

Patent Abstracts of Japan, vol. 12, No. 72 (E–588) (2919). Mar. 1988.

*Primary Examiner*—Robert E. Sellers
*Attorney, Agent, or Firm*—Antonelli, Terry, Stout & Kraus, LLP

[57] ABSTRACT

An epoxy resin molding material comprising an epoxy resin, a phenolic resin and a powder flexibilizer which has a core-shell structure composed of a solid silicone core and an organic polymer shell is an epoxy resin molding material for sealing electronic parts.

25 Claims, No Drawings

SEMICONDUCTOR SEALANT OF EPOXY RESIN AND ORGANIC POLYMER-GRAFTED SILICONE POLYMER

This application is a Divisional application of application Ser. No. 08/536,141, filed Sep. 29, 1995, U.S. Pat. No. 5,739,217, the contents of which are incorporated herein by reference in their entirety.

BACKGROUND OF THE INVENTION

The present invention relates to an epoxy resin molding material for sealing electronic parts which is excellent in thermal shock resistance, reflow soldering resistance and moldability, and to a semiconductor device sealed with the epoxy resin molding material, particularly to a plastic-packaged LSI for surface mounting.

Epoxy resin molding materials have been widely used in large quantities for sealing electronic parts, such as transistors, IC, etc. The reason is that epoxy resins are well-balanced in various properties including electric properties, thermal resistance, mechanical strength and adhesiveness to inserts. Particularly, combinations of o-cresol novolac epoxy resins and phenol novolac hardeners are especially well-balanced in these properties, and have been used as the main base resins of molding materials for IC-sealing.

However, the recent downsizing and thinning of packages of electronic parts, typically of IC packages, have caused cracking of such packages on cyclic cooling and heating and demand further improvement in thermal shock resistance.

The conventional means of improving the thermal shock resistance of epoxy resin molding materials are (1) dispersing liquid silicones in epoxy resin molding materials;

(2) the method disclosed in Japanese Patent Application Kokai Koho (Laid-open) No. 1-272620, wherein epoxy resins or hardeners are previously modified with siloxane compounds; and (3) the methods disclosed in Japanese Patent Application Kokai Koho (Laid-open) Nos. 61-185527, 62-93962, 62-147749 and 5-175369, wherein epoxy resins are modified with silicone polymer powder.

The method (1) lowers the cracking resistance during reflow soldering processes and marking properties, and also deteriorates the appearance of molded products due to the bleeding of the liquid silicones. The method (2) tends to lower glass transition temperature, thereby deteriorating the thermal resistance of packages. Every method (3), namely the modification with silicone polymer powder, successively lower the elastic moduli of epoxy resin compositions and decreases the stress generated on the interface between IC elements and epoxy resin molding materials. However, the methods disclosed in Japanese Patent Application Kokai Koho (Laid-open) Nos. 61-185527 and 5-175369, wherein solid silicones are dispersed, have a shortcoming of lowering the breaking point and elongation at break of resulting epoxy resin molding materials. Such a shortcoming seems to be caused by the poor affinity between the silicone particles and the epoxy resins. As disclosed in Japanese Patent Application Kokai Koho (Laid-open) Nos. 62-93962 and 62-147749, coating the surface of silicone particles with resins which are compatible with epoxy resins improves the affinity, and obviates to some degree the decrease in strength and elongation. However, the cores of the particles produced by these methods are liquid silicones or contain liquid silicones, and there arise various troubles due to the presence of the liquid silicones. The particular troubles made by such liquid components are the deterioration of the marking properties of the surface of packaged IC and the debonding and falling of ICs from wiring boards on which the ICs have been temporarily fixed with adhesives for mounting.

SUMMARY OF THE INVENTION

An object of the present invention is to provide a very reliable epoxy resin molding material for sealing electronic parts which applies little stress to semiconductor elements, has high thermal shock resistance and makes no troubles of the surfaces of molded products. Particularly, for the reliability of ICs for surface mounting, the improvement of cracking resistance under reflow soldering conditions presents an important problem.

The present invention provides an epoxy resin molding material for sealing an electronic part, characterized by containing (A) an epoxy resin having at least two epoxy groups per molecule, (B) a compound having at least two phenolic hydroxyl groups per molecule and (C) a powder which
  (1) has a structure comprising a solid silicone core and an organic polymer shell,
  (2) the solid silicone comprising a $[RR'SiO_{2/2}]$ unit, wherein R is an alkyl group of 6 or less carbon atoms, an aryl group or a functional group having a terminal carbon-carbon double-bond, and R' is an alkyl group of 6 or less carbon atoms or an aryl group, and also provides a semiconductor device sealed with the molding material.

PREFERRED EMBODIMENTS OF THE INVENTION

The epoxy resin having at least two epoxy groups per molecule, which is the component (A) to be used in the present invention, may be any one selected from common epoxy resin molding materials for sealing electronic parts, and some examples include an epoxidation product of a novolac resin produced from a phenol and an aldehyde, such as a phenolic novolac epoxy resin or an o-cresol novolac epoxy resin, a diglycidyl ether, such as diglycidyl ether of bisphenol A, bisphenol F, bisphenol S or an alkyl-substituted biphenol, a glycidylamine epoxy resin which is a reaction product of a polyamine, such as diaminodiphenylmethane or isocyanuric acid, with epichlorohydrin, and a linear aliphatic epoxy resin and an alicyclic epoxy resin which is an oxidation product of an olefin bond with a peracid, such as peracetic acid.

Among these epoxy resins (A) those are particularly excellent in reflow soldering resistance are substituted or non-substituted epoxy resins having a biphenyl skeleton, which are preferably at least 60% by weight of the total of the epoxy resins used. In an amount of less than 60% by weight, such epoxy resins cannot exhibit their remarkable features of low moisture absorption and high adhesion, and will not take sufficient effect in the objective improvement of reflow soldering resistance. The examples of such epoxy resins include epoxidation products of 4,4'-bishydroxybiphenyl or 4,4'-bishydroxy-3,3',5,5'-tetramethylbiphenyl with epichlorohydrin.

These epoxy resins (A) may be used in combination of any number, but with respect to their purity, particularly, their hydrolyzable chlorine content is preferably low because of their bad influence on the corrosion of aluminum circuit patters on chips, such as ICs, and is preferably not more than 500 ppm to endow epoxy resin molding materials for sealing electronic parts with high moisture resistance. Herein, the content of hydrolyzable chlorine is obtained by dissolving 1 g of a sample epoxy resin in 30 ml of dioxane, adding thereto 5 ml of 1 N-KOH methanol solution, refluxing for 30 minutes and carrying out measurement by potentiometric titration.

Some examples of the component (B) to be used in the present invention, namely the compound having at least two phenolic hydroxyl groups per molecule, include a resin produced by condensation or co-condensation of a phenol, such as phenol, cresol, a xylenol, resorcinol, catechol, bisphenol A or bisphenol F, or a naphthol, such as α-naphthol, β-naphthol or a dihydroxynaphthalene, with an aldehyde, such as formaldehyde, acetaldehyde, propionaldehyde, benzaldehyde or salicylaldehyde, in the presence of an acid catalyst, polyparavinylphenol resin, a phenol-aralkyl resin having xylylene groups, which is synthesized from a phenol and dimethoxyparaxylylene, and a phenol having at least one alicyclic skeleton in its structure, and these may be used individually or in combination of two or more.

Among these epoxy resins (A) and these compounds (B) having at least one phenolic hydroxyl group which may be used in the present invention, resins and compounds having at least one naphthalene ring or saturated aliphatic ring are excellent in reflow cracking resistance. Some examples are a novolac resin synthesized from a hydroxynaphthalene and an aldehyde, and a resin obtained by epoxidation of such a novolac resin. Some examples of the compounds having at least one saturated aliphatic ring are a resin synthesized by addition reaction of a phenols to dicyclopentadiene in the presence of an acid catalyst or the like, and a resin obtained by epoxidation of such a resin. These resins or compounds are preferably added so that the total weight of naphthalene rings and saturated aliphatic rings is 20% by weight or more, preferably 20 to 70% by weight, based on the total weight of (A)+(B). In an amount of less than 20% by weight, the naphthalene rings and saturated aliphatic rings cannot exhibit enough hydrophobic property to reduce moisture absorption, and the reflow cracking resistance cannot be improved effectively. When used in combination with the above-described biphenyl skeleton epoxy resins, these epoxy resins or phenolic compounds having such structures exhibit their excellent reflow cracking resistance more effectively.

The equivalent ratio of the phenolic compound (B) to the epoxy resin (A) (the number of hydroxyl groups of (B)/the number of epoxy groups of (A)) is not particularly limited, and the preferred range of the ratio is 0.7 to 1.3 for the purpose of decreasing unreacted materials.

The silicone particle of the powder (C) to be used in the present invention is solid at room temperature and is covered with a shell of an organic polymer. The silicone polymer composing the core is a polymerization product mainly from a diorganosiloxane having a $[RR'SiO_{2/2}]$ unit, and preferably contains, as a crosslinker, a trifunctional siloxane unit ($[RSiO_{3/2}]$) or a tetrafunctional siloxane unit ($[SiO_{4/2}]$). As the contents of these components increase, the hardness and elastic modulus of the silicone polymer composing the core are increased, so that the elastic modulus and stress property of the objective epoxy resin molding material for sealing electronic parts cannot be decreased effectively. The total content of the trifunctional and tetrafunctional siloxane components is preferably 0.5 to 20 mol %, and the content of the trifunctional siloxane component is preferably 2 to 10 mol %. As the content of the trifunctional or tetrafunctional siloxane component decreases, the elastic modulus of the resulting polymer decreases, but the amount of unreacted siloxane increases because of the lower crosslink density. As a result, the marking property of the molded components decreases because of the migration of the unreacted siloxane. Therefore, the total content of the trifunctional and tetrafunctional siloxane component is preferably at least 0.5 mol %, more preferably at least 2 mol %.

The hardness of the core is an important factor to obtain a reliable epoxy resin molding material for sealing electronic parts which applies little stress to semiconductor chips, has high thermal shock resistance and makes no troubles of surfaces of molded products. According to the present invention, the hardness can easily be adjusted to an optimum value by varying the amount of the trifunctional and tetrafunctional components.

As to the units $[RSiO_{3/2}]$ and $[RR'SiO_{2/2}]$, which are the components contained in the core of (C), R' is preferably an alkyl group of 6 or less carbon atoms, such as methyl group or ethyl group, or an aryl group, such as phenyl group (R' may be of one kind or of two or more kinds), and methyl group is preferable from the viewpoint of reducing elastic modulus and lower cost. Although the preferred examples of R are the same alkyl groups and aryl groups as the above-described preferred examples of R' (R may be of one kind or of two or more kinds, and R may be identical with or different from R'), it is preferable that R at least partially has a functional group having a terminal carbon-carbon double bond. The reason is that when the shell of the organic polymer is formed by vinyl polymerization after the polymerization of the core, the carbon-carbon double bonds in the core are grafted with the organic polymer composing the shell, so that the core/shell interface is strongly linked by covalent bonds. The content of siloxane units with such carbon-carbon double bonds is preferably 1 to 10 mol % based on the total units of the silicone polymer composing cores. Less than 1 mol % of carbon-carbon double bonds cannot give effective grafting, and more than 10 mol % of carbon-carbon double bonds are apt to deteriorate the properties of core, such as thermal resistance and elasticity. Some examples of such functional groups having carbon-carbon double bonds include vinyl group, allyl group, methacrylic group, methacryloxy group or alkyl groups having these groups as terminal functional groups.

The organic polymer shell covering the surface of the silicone particle of the powder (C) is preferably compatible with the epoxy resin and hardener which constitute the matrix resin of the epoxy resin molding material for sealing electronic parts. Some examples of such a resin include a compound synthesized by a vinyl polymerization, such as polyvinylbutyral, polyvinylacetate, polystyrene, an acrylic polymer or an acrylic copolymer, and the particularly preferred are an acrylic polymer or an acrylic copolymer. Some examples of the acrylic polymer include a polymerization product of acrylic acid, an ester thereof, methacrylic acid, an ester thereof, an acrylic amide or acrylonitrile, and a conventional copolymer thereof with other monomers, such as styrene. It is not limited but preferable from the viewpoint of improving toughness and hydrolysis resistance that the acrylic polymer is a polymethacrylic ester, and polymethylmethacrylate or a copolymer thereof is more preferable because of its low cost and high reactivity.

In the case where the shell covering the surface of the silicone particle of the powder (C) requires good thermal resistance, the desirable organic polymer composing the shell is a vinyl ester resin having aromatic rings.

The amount of the organic polymer shell is preferably the minimum sufficient to cover the silicone particle uniformly, and the weight ratio of the silicone:the organic polymer is preferably from 1:1 to 5:1.

The silicone powder (C) is produced, for example, by synthesizing the silicone to be the core by an emulsion polymerization, and then carrying out the second-stage polymerization for forming the shell by adding an acrylic monomer and an initiator. In such a case, by adding a proper amount of a siloxane compound having at least one double bond to the siloxane monomer or oligomer used in the first-stage polymerization, the formed acrylic polymer is grafted with the double bond to give strong bonding between the core and the shell, and the silicone powder obtained by such a process increases the strength of molded components.

The size of the silicone particle of the component (C) is preferably smaller because the composition can be modified uniformly, and the average primary particle size ranges preferably from 0.05 to 1.0 µm, more preferably from 0.05 to 0.5 µm. Herein, the terms "primary particle size" mean the diameter of particles which are not coagulated.

The epoxy resin molding material for sealing electronic parts may contain a accelerator for accelerating the curing of the epoxy resin and the compound having phenolic hydroxyl groups. Some examples of the cure accelerator include a tertiary amine, such as 1,8-diazabicyclo(5,4,0)undecene-7, triethylenediamine, benzyldimethylamine, triethanolamine, dimethylaminoethanol or tris(dimethylaminomethyl)phenol, an imidazole, such as 2-methylimidazole, 2-phenylimidazole, 2-phenyl-4-methylimidazole or 2-heptadecylimidazole, an organophosphine, such as tributylphosphine, methyldiphenylphosphine, triphenylphosphine, diphenylphosphine or phenylphosphine, and a tetraphenylborate, such as tetraphenylphosphonium-tetraphenylborate, triphenylphosphine-tetraphenylborate or N-methylmolpholine-tetraphenylborate.

The epoxy resin molding material for sealing electronic parts of the present invention may also contain one or more inorganic fillers, such as a powder of fused silica, crystal silica, alumina, zircon, calcium silicate, calcium carbonate, silicon carbide, boron nitride, beryllia or zirconia, spherical beads produced therefrom, single crystal fiber of potassium titanate, silicon carbide, silicon nitride or alumina, or glass fiber. The content of such inorganic fillers is preferably 70% by weight or more, more preferably 70 to 95% by weight, based on the weight of the molding material, to decrease moisture absorption and linear expansion coefficient and to increase strength. Among these inorganic fillers, fused silica is preferable to decrease linear expansion coefficient, alumina is preferable to increase thermal conductivity, and the shape of the fillers is preferably spherical to improve the flowability during molding and the wear of molding dies.

The epoxy resin molding material for sealing electronic parts of the present invention may further contain a release agent, such as a higher fatty acid, a metallic salt of a higher fatty acid, an ester wax or a polyethylene wax, a coloring agent, such as carbon black, and a coupling agent, such as an epoxysilane, an aminosilane, an alkylsilane, a vinylsilane, an organotitanate or an aluminum alcoholate.

The epoxy resin molding material for sealing electronic parts of the present invention may further contain a flame retardant, for example, a halogenated compound, such as a brominated bisphenol A or an epoxidation product thereof, antimony trioxide, antimony pentaoxide or aluminum hydroxide.

The molding material is generally made by mixing sufficiently a mixture containing formulated amounts of the above-described materials with, for example, a mixer, followed by kneading with hot rolls or an extruder, cooling and grinding.

Although a low pressure transfer molding is the most general method of sealing electronic parts by using the molding material of the present invention, an injection molding, compression molding or casting may also be employed.

The molding material of the present invention is characterized in having such thermal shock resistance (testing method: table 6) that no molded products are damaged up to 1000 cycles, such soldering resistance (testing method: table 6) that half or less of molding products (by total molded products) are damaged for 48 hours, preferably no molding products are damaged for 48 hours, more preferably for 72 hours, and a critical surface tension (testing method: table 6) of 28 dyne/cm or more.

Hereinafter the present invention will be described referring to Examples, which however do not limit the scope of the present invention.

EXAMPLES 1 TO 12 AND COMPARATIVE EXAMPLES 1 TO 5

In Examples 1 to 6, molding materials were prepared by mixing a cresol novolac epoxy resin having an epoxy equivalent weight of 220 and a softening point of 67° C., a brominated bisphenol A epoxy resin having an epoxy equivalent weight of 375, a softening point of 80° C. and a bromine content of 48% by weight, a phenol novolac resin having a hydroxyl equivalent weight of 106 and a softening point of 83° C., 1,8-diazabicyclo(5,4,0)undecene-7, carnauba wax, antimony trioxide, carbon black, γ-glycidoxypropyltrimethoxysilane as a coupling agent, a fused silica powder, and powders #1–#6 (Table 1) each having a core-sell structure composed of a solid silicone core and an organic polymer shell, in the weight ratios as listed in Table 2, and then roll-kneading each mixture at a kneading temperature of 80 to 90° C. for a kneading time of 10 minutes.

In Comparative Example 1, a molding material was prepared in the same manner as in Example 2 except that a powder #7 (consisting only of the silicone cores of the powder #2) was added in place of the powder #2.

In Comparative Example 2, a molding material was prepared in the same manner as in Example 2 except that, in place of the powder #2, a powder #8 having a core-shell structure of a liquid silicone core containing no crosslinker and the same PMMA shell as that of the powder #2 was used.

In Comparative Example 3, a molding material was prepared in the same manner and mixing composition as in Examples 1 to 6 except that a liquid silicone was added as a flexibilizer.

In Comparative Example 4, a molding material was prepared in the same manner and mixing composition as in Examples 1 to 6 except that no powders were added.

In Examples 7 to 12, molding materials were prepared by using the same powder #2 used in Example 2 in the same manner as in Example 2 except that the epoxy resins and curing agents represented by the following formulae (1) to (5):

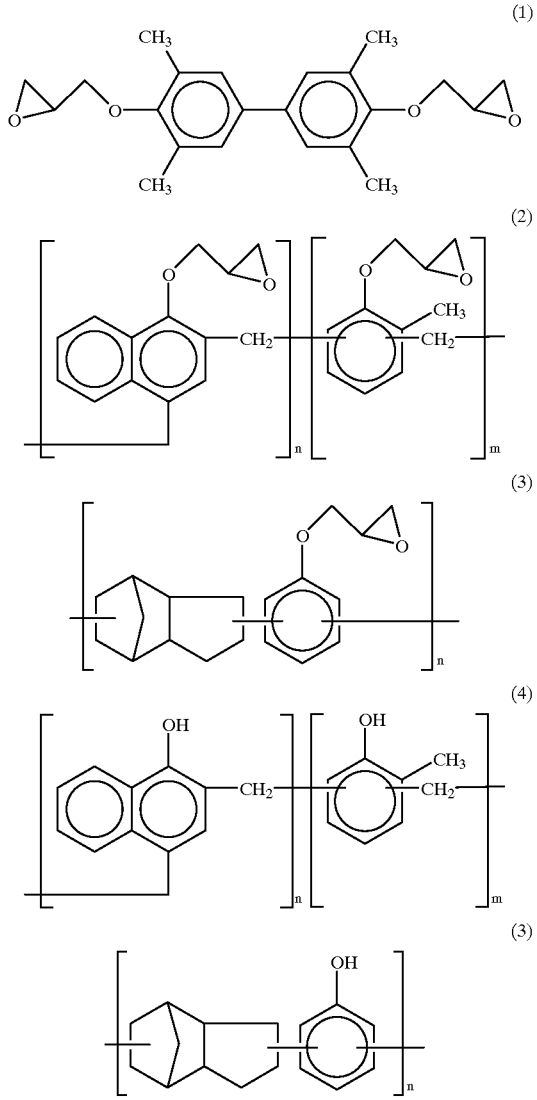

were used in place of the o-cresol novolac epoxy resin and phenolic novolac resin which were used in Example 2 (Table 3). In Comparative Example 5, a molding material was prepared in the same manner and mixing composition as in Example 12 except that a liquid silicone was added as a flexibilizer.

The properties of the molding materials prepared in these Examples and Comparative Examples are listed in Table 4 and Table 5, and the detail of the methods of evaluating the properties are listed in Table 6.

The results show that all the molding materials prepared in Examples 1 to 12 are excellent in thermal shock resistance, humidity resistance, appearance of molded products and marking properties. As shown also in Comparative Example 2, good thermal shock resistance and good humidity resistance can be given by using silicone powders of core-shell structure as flexibilizer. However, in Comparative Example 2 wherein a liquid silicone was used as the core material, the marking properties were adversely affected by the flexibilizer because the unreacted silicone bled to the surface of the cured molding material and lowered the critical surface tension. Further, in Comparative Example 1 wherein the powder having no PMMA shell was used as a flexibilizer, not only the thermal shock resistance but also the marking properties were lowered. In Comparative Example 3 wherein a liquid silicone was used alone, thermal shock resistance was good, but the reflow soldering resistance and the marking properties were lowered.

Moreover, as shown in Examples 7 to 12, the use of the silicone powders of the core-shell structure of the present invention together with the matrix resins having good reflow soldering resistance gave molding materials which are excellent in various properties including reflow soldering resistance, thermal shock resistance, humidity resistance and marking properties, all of which are the properties required of plastic packages of LSIs for surface mounting. In Comparative Example 5 wherein the molding material was prepared in the same manner and mixing composition as in Example 12 except a liquid silicone was used as the flexibilizer, both the reflow soldering resistance and the marking properties were lowered.

TABLE 1

| Item | #1 | #2 | #3 | #4 | #5 | #6 | #7 | #8 |
|---|---|---|---|---|---|---|---|---|
| Core material (mol %) | | | | | | | | |
| DM* 1 | 99 | 95 | 90 | 95 | 95 | 95 | 95 | 100 |
| TM* 2 | 0 | 3 | 8 | 3 | 3 | 3 | 3 | 0 |
| XDM* 3 | 1 | 2 | 2 | 2 | 2 | 2 | 2 | 0 |
| Core hardness | soft | medium | hard | medium | medium | medium | medium | liquid |
| Shell material (wt ratio) | | | | | | | | |
| PMMA* 4 | 1 | 1 | 1 | 1 | 0.5 | 0 | — | 1 |
| PSt* 5 | 0 | 0 | 0 | 0 | 0.5 | 1 | — | 0 |
| Core/Shell (wt. ratio) | 2/1 | 2/1 | 2/1 | 2/1 | 2/1 | 2/1 | 2/0 | 2/1 |
| Primary particle size (μm) | 0.12 | 0.11 | 0.10 | 0.06 | 0.11 | 0.12 | 0.12 | 0.14 |

* 1: octamethylcyclotetrasiloxane
* 2: methyltrimethoxysilane
* 3: methacryloxypropyl - trimethoxysilane
* 4: polymethylmethacrylate
* 5: polystyrene

TABLE 2

(unit: weight parts per 100 weight parts of total epoxy resins)

| Item | Example No. 1 | 2 | 3 | 4 | 5 | 6 | Comparative Example No. 1 | 2 | 3 | 4 |
|---|---|---|---|---|---|---|---|---|---|---|
| Powder flexibilizer | | | | | | | | | | |
| No. | #1 | #2 | #3 | #4 | #5 | #6 | #7 | #8 | — | — |
| Added amount | 15.0 | 15.0 | 15.0 | 15.0 | 15.0 | 15.0 | 15.0 | 15.0 | — | — |
| Liquid flexibilizer *1 | — | — | — | — | — | — | — | — | 15.0 | — |
| Cresol novolac epoxy resin *2 | 85.0 | 85.0 | 85.0 | 85.0 | 85.0 | 85.0 | 85.0 | 85.0 | 85.0 | 85.0 |
| Brominated epoxy resin *3 | 15.0 | 15.0 | 15.0 | 15.0 | 15.0 | 15.0 | 15.0 | 15.0 | 15.0 | 15.0 |
| Phenol novolac resin | 45.2 | 45.2 | 45.2 | 45.2 | 45.2 | 45.2 | 45.2 | 45.2 | 45.2 | 45.2 |
| DBU *4 | 1.8 | 1.8 | 1.8 | 1.8 | 1.8 | 1.8 | 1.8 | 1.8 | 1.8 | 1.8 |
| Antimony trioxide | 4.0 | 4.0 | 4.0 | 4.0 | 4.0 | 4.0 | 4.0 | 4.0 | 4.0 | 4.0 |
| Carnauba wax | 2.0 | 2.0 | 2.0 | 2.0 | 2.0 | 2.0 | 2.0 | 2.0 | 2.0 | 2.0 |
| Carbon black | 2.0 | 2.0 | 2.0 | 2.0 | 2.0 | 2.0 | 2.0 | 2.0 | 2.0 | 2.0 |
| Coupling agent *5 | 3.0 | 3.0 | 3.0 | 3.0 | 3.0 | 3.0 | 3.0 | 3.0 | 3.0 | 3.0 |
| Fused silica powder | 519.0 | 519.0 | 519.0 | 519.0 | 519.0 | 519.0 | 519.0 | 519.0 | 519.0 | 474.0 |
| Ratio of fused silica powder | 75% | 75% | 75% | 75% | 75% | 75% | 75% | 75% | 75% | 75% |

*1: dimethylsilicone oil (10,000 cs)
*2: o - cresol novolac epoxy resin
*3: tetrabromobisphenolA diepoxy resin
*4: 1.8 - diazabicyclo (5, 4, 0) undecene - 7
*5: γ - glycidoxypropyltrimethoxysiloxane

TABLE 3

(unit: weight parts per 100 weight parts of total epoxy resins)

| Item | Example Nos. 7 | 8 | 9 | 10 | 11 | 12 | Comp. Ex. No. 5 |
|---|---|---|---|---|---|---|---|
| Powder flexibilizer | | | | | | | |
| No. | #2 | #2 | #2 | #2 | #2 | #2 | #2 |
| Added amount | 15.0 | 15.0 | 15.0 | 15.0 | 15.0 | 15.0 | — |
| Liquid flexibilizer | — | — | — | — | — | — | 15.0 |
| Cresol novolac epoxy resin | — | — | — | 85.0 | 85.0 | — | — |
| Biphenyl epoxy resin *1 | 85.0 | — | — | — | — | 85.0 | 85.0 |
| Napahthalene skeleton epoxy resin *2 | — | 85.0 | — | — | — | — | — |
| DCP skeleton epoxy resin *3 | — | — | 85.0 | — | — | — | — |
| Phenol novolac resin | 52.2 | 43.4 | 38.9 | — | — | — | — |
| Napahthalene skeleton novolac resin *4 | — | — | — | 59.7 | — | 68.9 | 68.9 |
| DCP skeleton phenolic resin *5 | — | — | — | — | 73.3 | — | — |
| Brominated epoxy resin | 15.0 | 15.0 | 15.0 | 15.0 | 15.0 | 15.0 | 15.0 |
| DBU | 1.8 | 1.8 | 1.8 | 1.8 | 1.8 | 1.8 | 1.8 |
| Antimony trioxide | 4.0 | 4.0 | 4.0 | 4.0 | 4.0 | 4.0 | 4.0 |
| Carnauba wax | 2.0 | 2.0 | 2.0 | 2.0 | 2.0 | 2.0 | 2.0 |
| Carbon black | 2.0 | 2.0 | 2.0 | 2.0 | 2.0 | 2.0 | 2.0 |
| Coupling agent | 3.0 | 3.0 | 3.0 | 3.0 | 3.0 | 3.0 | 3.0 |
| Fused silica powder | 539.9 | 513.6 | 500.1 | 562.5 | 603.4 | 590.1 | 590.1 |
| Ratio of Fused silica powder | 75% | 75% | 75% | 75% | 75% | 75% | 75% |

*1: epoxy equivalent weight = 188, represented by the formula (1)
*2: epoxy equivalent weight = 230, n/m = 1/1, represented by the formula (2)
*3: epoxy equivalent weight = 260, represented by the formula (3)
*4: hydroxyl equivalent weight = 140, n/m = 1/1, represented by the formula (4)
*5: hydroxyl equivalent weight = 172, represented by the formula (5)

TABLE 4

| Item | Unit | Example No. 1 | 2 | 3 | 4 | 5 | 6 | Comp. Ex. No. 1 | 2 | 3 | 4 |
|---|---|---|---|---|---|---|---|---|---|---|---|
| Bending test | | | | | | | | | | | |
| Elastic modulus | GPa | 12.2 | 12.2 | 12.4 | 12.5 | 12.5 | 12.8 | 12.2 | 12.0 | 11.8 | 14.5 |
| Strength | MPa | 121 | 125 | 123 | 121 | 118 | 121 | 116 | 108 | 105 | 130 |
| Elongation | % | 1.12 | 1.18 | 1.11 | 1.05 | 1.00 | 1.00 | 0.95 | 1.10 | 1.00 | 0.95 |
| Glass transition temperature | °C. | 160 | 160 | 160 | 160 | 165 | 165 | 165 | 160 | 160 | 160 |

TABLE 4-continued

|  |  | Example No. | | | | | | Comp. Ex. No. | | | |
|---|---|---|---|---|---|---|---|---|---|---|---|
| Item | Unit | 1 | 2 | 3 | 4 | 5 | 6 | 1 | 2 | 3 | 4 |
| Adhesion strength | N/m | 350 | 360 | 380 | 350 | 330 | 330 | 260 | 320 | 280 | 270 |
| Critical surface tension | dyne/cm | 28 | 30 | 32 | 30 | 30 | 30 | <24 | <24 | <24 | 32 |
| Water absorption |  |  |  |  |  |  |  |  |  |  |  |
| 24 h | % | 0.20 | 0.21 | 0.21 | 0.23 | 0.23 | 0.23 | 0.22 | 0.20 | 0.24 | 0.18 |
| 168 h |  | 0.43 | 0.43 | 0.43 | 0.43 | 0.43 | 0.43 | 0.43 | 0.43 | 0.43 | 0.44 |
| Thermal shock resistance |  |  |  |  |  |  |  |  |  |  |  |
| 200 cyc. | The number of cracked | 0/20 | 0/20 | 0/20 | 0/20 | 0/20 | 0/20 | 0/20 | 0/20 | 0/20 | 12/20 |
| 500 cyc. | packages/The total number | 0/20 | 0/20 | 0/20 | 0/20 | 0/20 | 0/20 | 0/20 | 0/20 | 0/20 | 20/20 |
| 1000 cyc. | of tested packages | 0/20 | 0/20 | 0/20 | 0/20 | 0/20 | 0/20 | 10/20 | 0/20 | 0/20 | — |
| Reflow soldering resistance |  |  |  |  |  |  |  |  |  |  |  |
| 36 h | The number of cracked | 0/10 | 0/10 | 0/10 | 0/10 | 0/10 | 0/10 | 0/10 | 0/10 | 2/10 | 0/10 |
| 48 h | packages/The total number | 5/10 | 3/10 | 3/10 | 4/10 | 5/10 | 5/10 | 7/10 | 5/10 | 8/10 | 6/10 |
| 72 h | of tested packages | 10/10 | 10/10 | 10/10 | 10/10 | 10/10 | 10/10 | 10/10 | 10/10 | 10/10 | 10/10 |

TABLE 5

|  |  | Example No. | | | | | | Comp. Ex. No. |
|---|---|---|---|---|---|---|---|---|
| Item | Unit | 7 | 8 | 9 | 10 | 11 | 12 | 5 |
| Bending test |  |  |  |  |  |  |  |  |
| Elastic modulus | GPa | 12.4 | 12.1 | 12.3 | 12.1 | 12.2 | 12.2 | 12.0 |
| Strength | MPa | 127 | 125 | 128 | 123 | 127 | 125 | 122 |
| Elongation | % | 1.20 | 1.18 | 1.21 | 1.16 | 1.22 | 1.18 | 1.13 |
| Glass transition temperature | °C. | 135 | 160 | 150 | 160 | 150 | 150 | 150 |
| Adhesion strength | N/m | 520 | 450 | 410 | 420 | 400 | 610 | 480 |
| Critical surface tension | dyne/cm | 31 | 30 | 30 | 30 | 30 | 31 | <24 |
| Water absorption |  |  |  |  |  |  |  |  |
| 24 h | % | 0.19 | 0.17 | 0.17 | 0.18 | 0.18 | 0.16 | 0.20 |
| 168 h |  | 0.41 | 0.38 | 0.39 | 0.40 | 0.40 | 0.35 | 0.39 |
| Thermal shock resistance |  |  |  |  |  |  |  |  |
| 200 cyc. | The number of cracked | 0/20 | 0/20 | 0/20 | 0/20 | 0/20 | 0/20 | 0/20 |
| 500 cyc. | packages/The total number | 0/20 | 0/20 | 0/20 | 0/20 | 0/20 | 0/20 | 0/20 |
| 1000 cyc. | of tested packages | 0/20 | 0/20 | 0/20 | 0/20 | 0/20 | 0/20 | 0/20 |
| Reflow soldering resistance |  |  |  |  |  |  |  |  |
| 36 h | The number of cracked | 0/10 | 0/10 | 0/10 | 0/10 | 0/10 | 0/10 | 0/10 |
| 48 h | packages/The total number | 0/10 | 0/10 | 0/10 | 0/10 | 0/10 | 0/10 | 0/10 |
| 72 h | of tested packages | 2/10 | 3/10 | 3/10 | 4/10 | 4/10 | 0/10 | 5/10 |

TABLE 6

| Item Properties | Method (Standard) | Measuring machine | Measuring conditions | Remarks |
|---|---|---|---|---|
| Bending test | JIS - K - 6911 | Tensile tester (produced by Shimazu Seisakusho) | Room temperature | Three - point bending test |
| Glass transition temperature | Hitachi Chemical Method | Thermomechanical analyzer (produced by Rigaku Denki) | Heating speed 5° C./min | Bending point of linear expansion curve |
| Critical surface tension | JIS - K - 6768 | Wettability Standard Solution | Room temperature | Using molded disk for observing appearance |
| Adhesion strength | Hitachi Chemical Method | Tensile tester (produced by Shimazu Seisakusho) | Room temperature | Peeling strength of aluminum foil of 50 μm thick |
| Water absorption | JIS - K - 6911 | Chemical balance | 85° C. 85% RH | Rate of gain weight of molded disk (φ50 × t3) |
| Thermal shock resistance | IC: flat package, 10 × 14 × 2.7 (mm), 54 pins, 42 alloy lead frame, chip 6 × 6 × 0.4 (mm) | | | |

TABLE 6-continued

| Item Properties | Method (Standard) | Measuring machine | Measuring conditions | Remarks |
|---|---|---|---|---|
| (IC package cracking) | | | Molding: (180° C., 70 kg/cm$^2$, 90 sec.) + (180° C., 5 hours) Test: 150° C. (oil)/liquid nitrogen, two min., respectively (one cycle) Evaluation: The presence of cracks was observed with a microscope. n = 20 | |
| Reflow soldering resistance | | | IC: flat package, 19 × 14 × 2.7 (mm), 54 pins, 42 alloy lead frame, chip 6 × 6 × 0.4 (mm) | |
| (IC package cracking) | | | Molding: (180° C., 70 kg/cm$^2$, 90 sec.) + (185° C., 5 hours) Test: moistening at 85° C., at 85% RH, for a predetermined time, followed by VPS* at 215° C. for 90 sec. Evaluation: The presence of cracks was observed with a microscope. n = 10 | |

*Vapor Phase Soldering

When used for sealing electronic parts, such as IC or LSI, the epoxy resin molding material for sealing electronic parts provided by the present invention gives reliable products which are excellent in thermal shock resistance, reflow soldering resistance and humidity resistance and are free from the troubles that incompatible flexibilizers tend to make, such as deterioration of the appearance of molded products or lowering of marking properties, and, therefore, is very useful in industrial fields.

What is claimed is:

1. A semiconductor device comprising a semiconductor element sealed with an epoxy resin molding material, the epoxy resin molding material comprising (A) an epoxy resin having at least two epoxy groups per molecule; (B) a compound having at least two phenolic hydroxyl groups per molecule; and (C) a powder which (1) has a structure comprising a core of solid silicone polymer and a shell of organic polymer, in a weight ratio of solid silicone polymer organic polymer of from 1:1 to 5:1, (2) the solid silicone polymer comprising 80–99.5 mol % of a (RR'SiO$_{2/2}$) unit and 0.5 to 20 mol % of at least one of a (RSiO$_{3/2}$) unit and a (SiO$_{4/2}$) unit as a crosslinking agent, wherein R is an alkyl group of 6 or less carbon atoms, an aryl group or a functional group having a terminal carbon-carbon double-bond, and R' is an alkyl group of 6 or less carbon atoms or an aryl group, and wherein the solid silicone polymer contains 1–10 mol % of siloxane units with carbon-carbon double bond based on the total units of the solid silicone polymer.

2. The semiconductor device as claimed in claim 1, wherein the organic polymer in the component (C) is a compound synthesized by a vinyl polymerization.

3. The semiconductor device as claimed in claim 2, wherein the compound synthesized by the vinyl polymerization is an acrylic homopolymer resin or an acrylic copolymer resin.

4. The semiconductor device as claimed in claim 2, wherein the compound synthesized by the vinyl polymerization is a vinyl ester resin having an aromatic ring.

5. The semiconductor device as claimed in claim 1, wherein at least 60% by weight of the epoxy resin (A) is an epoxy resin derived from a substituted or a non-substituted biphenol.

6. The semiconductor device as claimed in claim 2, wherein at least 60% by weight of the epoxy resin (A) is an epoxy resin derived from a substituted or a non-substituted biphenol.

7. The semiconductor device as claimed in claim 3, wherein at least 60% by weight of the epoxy resin (A) is an epoxy resin derived from a substituted or a non-substituted biphenol.

8. The semiconductor device as claimed in claim 4, wherein at least 60% by weight of the epoxy resin (A) is an epoxy resin derived from a substituted or a non-substituted biphenol.

9. The semiconductor device as claimed in claim 1, wherein at least one of the epoxy resin (A) and the compound (B) contain a compound having a naphthalene ring.

10. The semiconductor device as claimed in claim 2, wherein at least one of the epoxy resin (A) and the compound (B) contain a compound having a naphthalene ring.

11. The semiconductor device as claimed in claim 5, wherein at least one of the epoxy resin (A) and the compound (B) contain a compound having a naphthalene ring.

12. The semiconductor device as claimed in claim 6, wherein at least one of the epoxy resin (A) and the compound (B) contain a compound having a naphthalene ring.

13. The semiconductor device as claimed in claim 1, wherein at least one of the epoxy resin (A) and the compound (B) contain a compound having a saturated aliphatic ring.

14. The semiconductor device as claimed in claim 2, wherein at least one of the epoxy resin (A) and the compound (B) contain a compound having a saturated aliphatic ring.

15. The semiconductor device as claimed in claim 5, wherein at least one of the epoxy resin (A) and the compound (B) contain a compound having a saturated aliphatic ring.

16. The semiconductor device as claimed in claim 6, wherein at least one of the epoxy resin (A) and the compound (B) contain a compound having a saturated aliphatic ring.

17. The semiconductor device as claimed in claim 1, wherein said at least one of the (RSiO$_{3/2}$) unit and the (SiO$_{4/2}$) unit is included in the solid silicone polymer in an amount of 1 to 20 mol % of the solid silicone polymer.

18. The semiconductor device as claimed in claim 1, wherein said at least one of the (RSiO$_{3/2}$) unit and the (SiO$_{4/2}$) unit is included in the solid silicone polymer in an amount of 2–20 mol % of the solid silicone polymer.

19. The semiconductor device as claimed in claim 1, wherein the solid silicone polymer includes 2–10 mol % of the (RSiO$_{3/2}$) unit.

20. The semiconductor device as claimed in claim 1, wherein the powder has an average primary particle size in a range of 0.05 to 1.0 μm.

21. The semiconductor device as claimed in claim 1, wherein the powder has an average primary particle size in a range of 0.05 to 0.5 μm.

22. The semiconductor device as claimed in claim 1, wherein R' is methyl.

23. The semiconductor device as claimed in claim 1, wherein the semiconductor element is a large-scale integrated circuit.

24. The semiconductor device as claimed in claim 1, wherein said epoxy resin having at least two epoxy groups per molecule includes a cresol novolac epoxy resin; wherein said compound having at least two phenolic hydroxyl groups per molecule is a phenol novolac resin; and wherein the solid silicone polymer includes a polymerization product of 90–99 mol % of octamethylcyclotetrasiloxane, up to 8 mol % of methyltrimethoxysilane and 1–2 mol % of methacryloxypropyltrimethoxysilane, and the organic polymer is polymethylmethacrylate.

25. The semiconductor device as claimed in claim 24, wherein said epoxy resin having at least two epoxy groups per molecule includes o-cresol novolac epoxy resin.

* * * * *